(12) United States Patent
Ghazavi et al.

(10) Patent No.: US 8,513,728 B2
(45) Date of Patent: Aug. 20, 2013

(54) ARRAY OF SPLIT GATE NON-VOLATILE FLOATING GATE MEMORY CELLS HAVING IMPROVED STRAPPING OF THE COUPLING GATES

(75) Inventors: Parviz Ghazavi, San Jose, CA (US);
Hieu Van Tran, San Jose, CA (US);
Shiuh-Luen Wang, San Jose, CA (US);
Nhan Do, Saratoga, CA (US); Henry A. Om'mani, Santa Clara, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 14 days.

(21) Appl. No.: 13/299,320

(22) Filed: Nov. 17, 2011

(65) Prior Publication Data

US 2013/0126958 A1    May 23, 2013

(51) Int. Cl.
*H01L 29/788*    (2006.01)

(52) U.S. Cl.
USPC ......... 257/320; 257/316; 257/319; 257/E29.3

(58) Field of Classification Search
USPC .............. 438/605; 257/315, 320, 316, 319, 257/E29.129, E29.3
See application file for complete search history.

(56) References Cited

U.S. PATENT DOCUMENTS

| | | | |
|---|---|---|---|
| 5,195,054 A | | 3/1993 | Noda |
| 6,643,186 B2 * | | 11/2003 | Tuan et al. ............... 365/185.33 |
| 6,747,310 B2 | | 6/2004 | Fan et al. |
| 7,800,159 B2 * | | 9/2010 | Widjaja et al. ............. 257/316 |
| 7,868,375 B2 | | 1/2011 | Liu et al. |
| 2005/0012137 A1 | | 1/2005 | Levi et al. |
| 2012/0182802 A1 * | | 7/2012 | Hung et al. .............. 365/185.11 |

OTHER PUBLICATIONS

PCT International Search Report of PCT/US12/61387; dated Jan. 4, 2013.
PCT Written Opinion of the International Searching Authority of PCT/US12/61387; dated Jan. 4, 20113.

* cited by examiner

*Primary Examiner* — Jarrett Stark
*Assistant Examiner* — Shahed Ahmed
(74) *Attorney, Agent, or Firm* — DLA Piper LLP (US)

(57) ABSTRACT

An array of non-volatile memory cells with spaced apart first regions extending in a row direction and second regions extending in a column direction, with a channel region defined between each second region and its associated first region. A plurality of spaced apart word line gates each extending in the row direction and positioned over a first portion of a channel region. A plurality of spaced apart floating gates are positioned over second portions of the channel regions. A plurality of spaced apart coupling gates each extending in the row direction and over the floating gates. A plurality of spaced apart metal strapping lines each extending in the row direction and overlying a coupling gate. A plurality of spaced apart erase gates each extending in the row direction and positioned over a first region and adjacent to a floating gate and coupling gate.

8 Claims, 2 Drawing Sheets

ARRAY OF SPLIT GATE NON-VOLATILE FLOATING GATE MEMORY CELLS HAVING IMPROVED STRAPPING OF THE COUPLING GATES

TECHNICAL FIELD

The present invention relates to an array of non-volatile memory cells with each cell having a floating gate and a coupling gate and an improved strapping mechanism for the coupling gates.

BACKGROUND OF THE INVENTION

Non-volatile memory cells having a floating gate for the storage of charges thereon are well known in the art. Referring to FIG. 1 there is shown a cross-sectional view of a non-volatile memory cell 10 of the prior art. The memory cell 10 comprises a semiconductor substrate 12, of a first conductivity type, such as P type. At or near a surface of the substrate 12 is a first region 14 of a second conductivity type, such as N type. Spaced apart from the first region 14 is a second region 16 also of the second conductivity type. Between the first region 14 and the second region 16 is a channel region 18. A word line 20, made of polysilicon is positioned over a first portion of the channel region 18. The word line 20 is spaced apart from the channel region 18 by a silicon (di)oxide layer 22. Immediately adjacent to and spaced apart from the word line 20 is a floating gate 24, which is also made of polysilicon, and is positioned over a second portion of the channel region 18. The floating gate 24 is separated from the channel region 18 by another insulating layer 30, typically also of silicon (di)oxide. A coupling gate 26, also made of polysilicon is positioned over the floating gate 24 and is insulated therefrom by another insulating layer 32. On another side of the floating gate 24, and spaced apart therefrom, is an erase gate 28, also made of polysilicon. The erase gate 28 is positioned over the second region 16 and is insulated therefrom. The erase gate 28 is also immediately adjacent to but spaced apart from the coupling gate 26 and is to another side of the coupling gate 26. The erase gate 28 has a slight overhang over the floating gate 24. In the operation of the memory cell 10, charges stored on the floating gate 24 (or the absence of charges on the floating gate 24) control the flow of current between the first region 14 and the second region 16. Where the floating gate 24 has charges thereon, the floating gate 24 is programmed. Where the floating gate 24 does not have charges thereon, the floating gate 24 is erased. The memory cell 10 is fully disclosed in U.S. Pat. No. 7,868,375 and in U.S. Pat. No. 6,747,310 whose disclosures are incorporated herein in their entirety by reference.

The memory cell 10 operates as follows. During the programming operation, when charges are stored on the floating gate 24, a first positive voltage in the shape of a pulse is applied to the word line 20 causing the portion of the channel region 18 under the word line 20 to be conductive. A second positive voltage, also in the shape of a pulse, is applied to the coupling gate 26. A third positive voltage, also in the shape of a pulse, is applied to the erase gate 28. A voltage differential also in the shape of a pulse, is applied between the first region 14 and the second region 16. All of the first positive voltage, second positive voltage, third positive voltage and the voltage differential are applied substantially at the same time, and terminate substantially at the same time. The electrons from the first region 14 are attracted to the positive voltage at the second region 16. As they near the floating gate 24, they experience a sudden increase in the electric field caused by the voltage applied to the coupling gate 26 and the erase gate 28, causing the charges to be injected onto the floating gate 24. Thus, programming occurs through the mechanism of hot electron injection.

During the erase operation when charges are removed from the floating gate 24, a high positive voltage is applied to the erase gate 28. A ground voltage can be applied to the coupling gate 26 and/or the word line 20. Charges on the floating gate 24 are attracted to the erase gate 28 by tunneling through the insulating layer between the floating gate 24 and the erase gate 28. In particular, the floating gate 24 may be formed with a sharp tip facing the erase gate 28, thereby facilitating the Fowler-Nordheim tunneling of electrons from the floating gate 24 through the tip and through the insulating layer between the floating gate 24 and the erase gate 28 onto the erase gate 28. As disclosed in U.S. Pat. No. 7,868,375 and U.S. Pat. No. 6,747,310, it may be beneficial to have a sharp edge or tip between the side wall of the floating gate 24 and the top surface of the floating gate 24 so that electrons may more readily tunnel from the floating gate 24 to the erase gate 28 during the erase operation.

During the read operation, a first positive voltage is applied to the word line 20 to turn on the portion of the channel region 18 beneath the word line 20. A second positive voltage is applied to the coupling gate 26. A voltage differential is applied to the first region 14 and the second region 16. If the floating gate 24 were programmed, i.e. the floating gate 24 stores electrons, then the second positive voltage applied to the coupling gate 26 is not able to overcome the negative electrons stored on the floating gate 24 and the portion of the channel region 18 beneath the floating gate 24 remains non-conductive. Thus, no current or a minimal amount of current would flow between the first region 14 and the second region 16. However, if the floating gate 24 were not programmed, i.e. the floating gate 24 remains neutral or perhaps even stores some holes, then the second positive voltage applied to the coupling gate 26 is able to cause the portion of the channel region 18 beneath the floating gate 24 to be conductive. Thus, a current would flow between the first region 14 and the second region 16.

In the prior art, memory cells 10 are arranged in a plurality of rows and columns forming an array 50. Referring to FIG. 2 there is shown a top view of the array 50 of the memory cells 10 of the prior art. The plurality of memory cells 10 are arranged so that each memory cell 10, defined by a first region 14 and its associated second region 16, and the channel region 18 therebetween extends in a column direction. Further each word line 20 extends in a row direction connecting a plurality of memory cells 10 in different columns. In addition, each coupling gate 26 also extends in a row direction connecting a plurality of memory cells 10 in different columns. Further, the erase gate 28 extends in a row direction and is shared by a pair of memory cells 10 in each column. Finally, the second region 16 extends in a row direction connecting a plurality of memory cells 10 in different columns.

Further, in the array 50 of the prior art, the coupling gates 26 are strapped. The strap consists of a metal gate line (not shown in FIG. 2, but lies above the coupling gate 26) that overlies each coupling gate line 26 and is insulated therefrom. Periodically, a contact 52 electrically connects the metal gate line to the associated coupling gate line 26. In the prior art, the contacts 52 are made every 128 columns for each row of memory cells 10, as shown in FIG. 2. The creation of contacts 52 or strapping points can cause potential process margin problems. In particular, because the contacts 52 are located at the same location (in the column direction, albeit in different rows), the minimum separation 54 of the contacts 52 is reduced. (it should be noted that the there is no encroachment on the erase gate 28 by the contacts 52 as they are in different planes.). The reduction in minimum separation 54 between the contacts 52 can cause a reduction in process margin, i.e. margin of error for process deviation is decreased. This can result in less yield.

Hence, it is one objective of the present invention to increase the process margin.

SUMMARY OF THE INVENTION

Accordingly, in the present invention an array of non-volatile memory cells has a semiconductor substrate of a first conductivity type with a top surface. A plurality of spaced apart first regions of a second conductivity type are in the substrate along the top surface. Each first region extends in a row direction. A plurality of spaced apart second regions of the second conductivity type are in the substrate along the top surface. Each second region is spaced apart from an associated first region in a column direction, perpendicular to the row direction. A channel region is defined between each second region and its associated first region in the column direction. Each channel region has a first portion and a second portion. A plurality of spaced apart word line gates extend in the row direction. Each word line gate is positioned over and is insulated from the first portion of a channel region, with each first portion of channel region immediately adjacent to the second region. A plurality of spaced apart floating gates are positioned over the second portions of the channel regions and are insulated therefrom. A plurality of spaced apart coupling gates extend in the row direction, with each coupling gate extending over and insulated from a plurality of floating gates. A plurality of spaced apart metal strapping lines extend in the row direction, with each metal strapping line associated with and overlying a coupling gate. A first metal strapping line is in a first row electrically connected to the associated underlying coupling gate in a plurality of first locations. A second metal strapping line is in a row immediately adjacent to the first row electrically connected to the associated underlying coupling gate in a plurality of second locations. The first locations and the second locations are not in the same column. A plurality of spaced apart erase gates extend in the row direction, with each erase gate positioned over a first region and insulated therefrom, and adjacent to and insulated from a floating gate and coupling gate.

DETAILED DESCRIPTION OF THE PREFERRED EMBODIMENT

Figure 1:
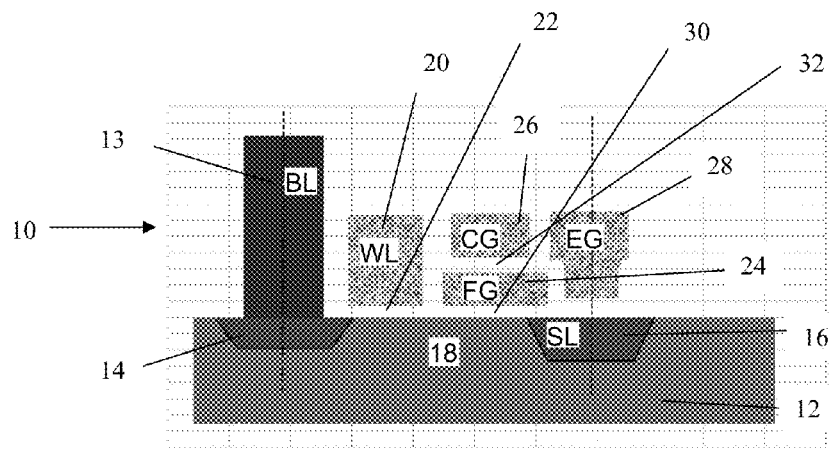
FIG. 1 is a cross-sectional view of a non-volatile memory cell of the prior art.
Figure 2:
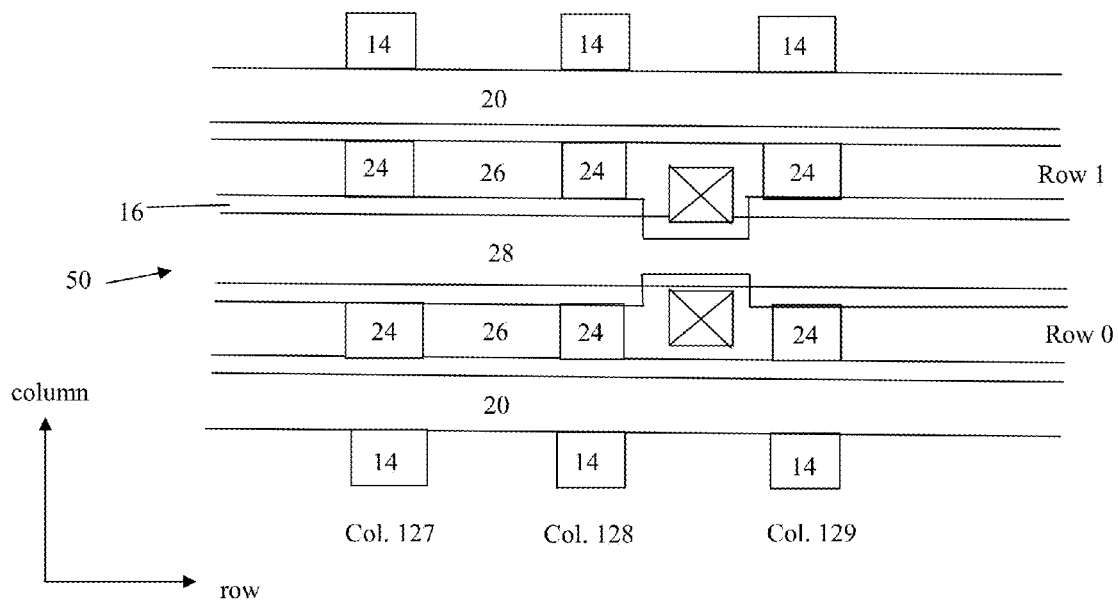
FIG. 2 is a top view of the prior art of an array of memory cells with the strapping of the coupling gates.
Figure 3:
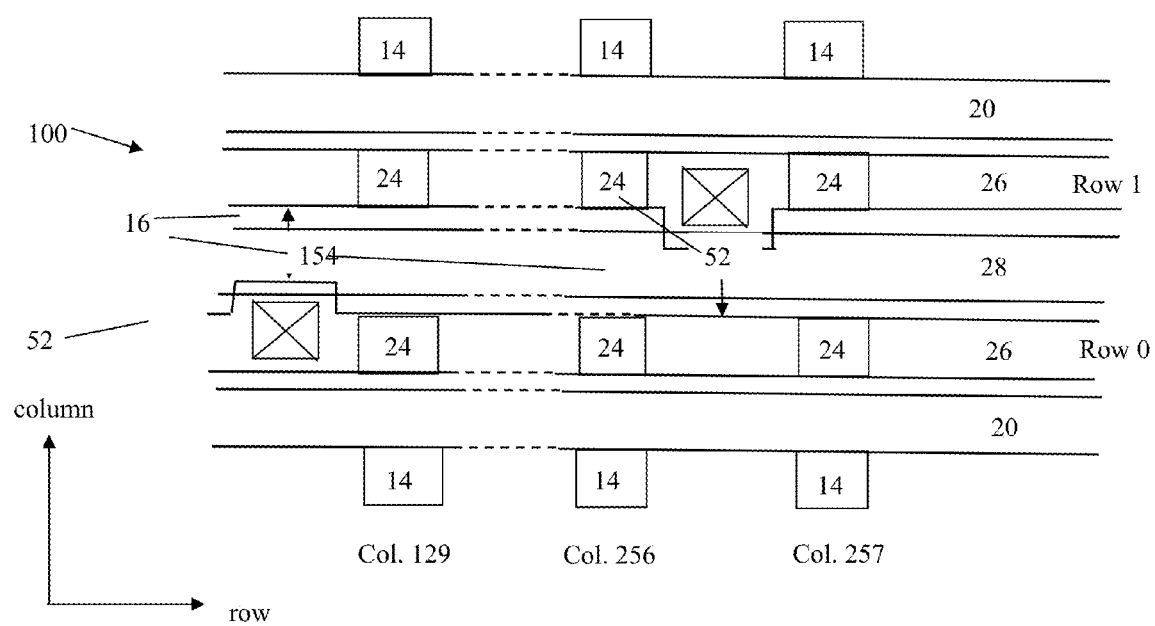
FIG. 3 is a top view of the present invention of an array of memory cells with improved strapping of the coupling gates.

Referring to FIG. 3 there is shown a top view of an array 100 of memory cells 10 of the present invention. Each of the memory cells 10 is as shown in FIG. 1 and described hereinabove. The memory cells 10 are connected in the same manner as shown in FIG. 2, and as described above, except for the strapping of the coupling gates 26. Thus, the plurality of memory cells 10 are arranged so that each memory cell 10, defined by a first region 14 and its associated second region 16, and the channel region 18 therebetween extends in a column direction. Further each word line 20 extends in a row direction connecting a plurality of memory cells 10 in different columns. In addition, each coupling gate 26 also extends in a row direction connecting a plurality of memory cells 10 in different columns. Further, the erase gate 28 extends in a row direction and is shared by a pair of memory cells 10 in each column. Finally, the second region 16 extends in a row direction connecting a plurality of memory cells 10 in different columns.

The strapping of the coupling gates 26, however, is as follows. The strap consists of a metal gate line (not shown in FIG. 3, but lies above the coupling gate 26) that overlies each coupling gate line 26 and is insulated therefrom. With respect to Row 0, a contact 52 electrically connects the metal gate line to the associated coupling gate line 26 at column line 128 and at column line 384, or periodically every 256 columns, but starting at column 128. With respect to Row 1, a contact 52 electrically connects the metal gate line to the associated coupling gate line 26 at column line 256 and at column line 512, or periodically every 256 columns, but starting at column 256. Thus, although the strapping of Rows 0 and 1 have the same periodicity, they are offset from one another by 128 columns. Further with respect to Row 2, the strapping is the same as the strapping for Row 0, or strapping at column line 128 and at column line 384, or periodically every 256 columns. As for Row 3, the strapping is the same as the strapping for Row 1 or strapping at column line 256 and at column line 512, or periodically every 256 columns.

The advantage of strapping with the present invention, can be seen by reference to FIG. 3. As can be seen from FIG. 3, the closest feature to the contacts 52 being strapped is the coupling gate 26 separated by a distance of 154. As the memory cell 10 is further scaled (i.e. shrunk in size) the distance 54 between the contacts 52 of the prior art array 50 (as shown in FIG. 2) will become increasingly smaller, and can lead to process margin errors. In contrast by staggering the location of the contacts 52, i.e. stagger them so that they do not lie in the same column, the distance 154 between the contacts 52 and the nearest feature may be made larger which allows for greater room for process margin error as the memory cell 10 is scaled.

While the array 100 has been described with straps of the control gate 26 being made with contacts 52 every 256 columns, it should be noted that the periodicity of the contacts 52 may be varied. However, while it is desirable to have the periodicity increased, i.e. the spacing between contacts 52 decreased, because this favors reducing the resistivity of the signal/power supplied to the polysilicon control gate 26, there is a penalty for increasing the periodicity of the strapping. In particular, strap efficiency is defined as:

=(area taken by all the straps in the width direction parallel to the word lines)/(area taken by Bit Lines in the width direction parallel to the word lines)*100

With a processing node of e.g. 70 nm, the strapping efficiency of the array 50 of the prior art, with strapping every 128 columns, was determined to be 15.52%. However, with the array 100 of the present invention, at the same processing node, and with the same memory cell 10 size, i.e. with strapping every 256 columns, the strapping efficiency was determined also to be 15.52%. However, it has been also discovered that even though the periodicity of the strapping has decreased, the tolerance to the increase in the resistivity of the coupling gates 28 is acceptable. This is because the coupling gates 28 serve only to supply a voltage during read (to compensate the state of storage on the floating gate 24) and during program, and no current flowing to or from the coupling gate 28 is required.

By removing one of the contacts that is immediately adjacent to one another in the column direction, this creates more space between the top and bottom of the control gate straps, thereby improving the process window for the word line polysilicon etch. As a result the strap height changes but the strap width along the word line direction does not change.

From the forgoing it can be seen that a array of non-volatile memory cells with improved coupling gate strapping to increase process margin is disclosed.

What is claimed is:

1. An array of non-volatile memory cells comprising:
   a semiconductor substrate of a first conductivity type having a top surface;
   a plurality of spaced apart first regions of a second conductivity type in said substrate along the top surface, each first region extending in a row direction;
   a plurality of spaced apart second regions of the second conductivity type, in said substrate along the top surface, each second region spaced apart from an associated first region in a column direction, perpendicular to the row direction;
   a plurality of spaced apart channel regions, with each channel region between a second region and its associated first region in the column direction; each of said channel regions having a first portion and a second portion;
   a plurality of spaced apart word line gates extending in the row direction, with each word line gate positioned over and insulated from the first portion of a plurality of channel regions, with each first portion of channel region immediately adjacent to the second region;
   a plurality of spaced apart floating gates, each floating gate positioned over the second portion of the channel region and insulated therefrom;
   a plurality of spaced apart coupling gates extending in the row direction, with each coupling gate extending over and insulated from a plurality of floating gates;
   a plurality of spaced apart metal strapping lines extending in the row direction, with each metal strapping line associated with and overlying a coupling gate, with a metal strapping line in a first row electrically connected to the associated underlying coupling gate in a plurality of first locations, and a metal strapping line in a row immediately adjacent to the first row electrically connected to the associated underlying coupling gate in a plurality of second locations, with said first locations and said second locations not in the same column; and
   a plurality of spaced apart erase gates, extending in said row direction, with each erase gate positioned over a first region and insulated therefrom, and adjacent to and insulated from a floating gate and coupling gate.

2. The array of claim 1 wherein each erase gate overhangs a portion of an adjacent floating gate.

3. The array of claim 1 wherein said first locations are spaced apart from one another by 256 columns, and said second locations are spaced apart from one another by 256 columns.

4. The array of claim 3 wherein each of said first locations and said second locations is offset from one another by 128 columns.

5. An array of non-volatile memory cells comprising:
   a semiconductor substrate of a first conductivity type having a top surface;
   a plurality of spaced apart first regions of a second conductivity type in said substrate along the top surface, each first region extending in a row direction;
   a plurality of spaced apart second regions of the second conductivity type, in said substrate along the top surface, each second region spaced apart from an associated first region in a column direction, perpendicular to the row direction;
   a plurality of spaced apart channel regions, with each channel region between a second region and its associated first region in the column direction; each of said channel regions having a first portion and a second portion;
   a plurality of spaced apart word line gates extending in the row direction, with each word line gate positioned over and insulated from the first portion of a plurality of channel regions, with each first portion of channel region immediately adjacent to the second region;
   a plurality of spaced apart floating gates, each floating gate positioned over the second portion of the channel region and insulated therefrom;
   a plurality of spaced apart coupling gates extending in the row direction, with each coupling gate extending over and insulated from a plurality of floating gates;
   a plurality of spaced apart metal strapping lines extending in the row direction, with each metal strapping line associated with and overlying a coupling gate, with each metal strapping lines in a first alternating rows electrically connected to the associated underlying coupling gate in a plurality of first locations, and each metal strapping lines in a second alternating rows immediately adjacent to the first alternating rows electrically connected to the associated underlying coupling gate in a plurality of second locations, with said first locations and said second locations not in the same column; and
   a plurality of spaced apart erase gates, extending in said row direction, with each erase gate positioned over a first region and insulated therefrom, and adjacent to and insulated from a floating gate and coupling gate.

6. The array of claim 5 wherein each erase gate overhangs a portion of an adjacent floating gate.

7. The array of claim 5 wherein said first locations are spaced apart from one another by 256 columns, and said second locations are spaced apart from one another by 256 columns.

8. The array of claim 7 wherein each of said first locations and said second locations is offset from one another by 128 columns.

* * * * *